(12) United States Patent
Biggins

(10) Patent No.: US 6,948,295 B2
(45) Date of Patent: Sep. 27, 2005

(54) DUAL-FUNCTION RECYCLABLE PLATFORM

(75) Inventor: Patrick L. Biggins, Minnetonka, MN (US)

(73) Assignee: Cardiac Science, Inc., Irvine, CA (US)

(*) Notice: Subject to any disclaimer, the term of this patent is extended or adjusted under 35 U.S.C. 154(b) by 0 days.

(21) Appl. No.: 10/447,682

(22) Filed: May 29, 2003

(65) Prior Publication Data

US 2004/0237476 A1 Dec. 2, 2004

(51) Int. Cl.[7] .............................................. B65B 11/00
(52) U.S. Cl. ............................. 53/472; 53/201; 53/393; 53/390; 108/17
(58) Field of Search ............................. 108/115, 11, 14, 108/17; 53/472, 131.1, 201, 393, 390

(56) References Cited

U.S. PATENT DOCUMENTS

| 3,915,529 A | * | 10/1975 | Bernier ........................ 312/237 |
| 4,226,486 A | * | 10/1980 | Roberts et al. ................ 312/21 |
| 6,109,444 A | * | 8/2000 | Bagwell et al. |
| 6,113,202 A | * | 9/2000 | Germano ...................... 312/245 |
| 6,311,460 B1 | * | 11/2001 | Bagwell et al. |
| 6,454,064 B1 | * | 9/2002 | Cheng .......................... 190/11 |

* cited by examiner

Primary Examiner—John Paradiso
(74) Attorney, Agent, or Firm—Patterson, Thuente, Skaar & Christensen, P.A.

(57) ABSTRACT

The present invention relates to a device and methods for manufacturing and shipping goods using a work platform that easily converts into a protective cover for use during shipment of the finished good. The device of the present invention reduces waste generated by the manufacturing and shipping processes through the use of a platform capable of retaining a good during both assembly and shipment. When shipment is complete, the platform is preferably constructed of a material that is recyclable. During assembly, the work platform exists as a single, planar platform comprising a first support surface and a second support surface fixedly joined at an interface. During shipment, the protective cover exists as the first support surface and second support surface fixedly interconnected in a parallel orientation.

14 Claims, 10 Drawing Sheets

US 6,948,295 B2

DUAL-FUNCTION RECYCLABLE PLATFORM

FIELD OF THE INVENTION

The present invention relates generally to the field of manufacturing and shipping goods. More specifically, the present invention relates to a recyclable platform serving a dual-function as both a work holder during manufacturing and a protective insert during shipment of a manufactured good.

BACKGROUND OF THE INVENTION

Taken separately, the use of work holders in manufacturing goods and the use of protective inserts for shipping goods are well known to industry. Work holders are currently used in a wide variety of industries. For example, work holders are often used in the semiconductor industry where much effort has been directed to using ultra-clean manufacturing processes. Work holders are also used in more traditional manufacturing environments such as automobile manufacturing where they can be used to hold and position large components during assembly. Regardless of the industry, work holders are beneficial because they can be used to repeatedly position goods to promote assembly and transport between assembly stations.

Protective inserts are commonly used in conjunction with shipping packaging whenever there is concern that an item could be damaged in transit. These inserts can comprise a wide variety of shapes, configurations and materials. Typically, these protective inserts are custom tailored for use with a specific product. As such, the protective inserts have little value when transport is complete resulting in them being discarded in the trash and occupying space in landfills.

SUMMARY OF THE INVENTION

The dual-function recyclable platform of the present invention overcomes the limitations associated with disposal of current packing insert designs. In addition, the dual-function recyclable platform serves as a work holder during assembly of the manufactured good. Through the use of the dual-function recyclable platform, a manufacturer can eliminate the need for separate work holders and packaging inserts. In addition, the manufacturer can reduce the time required for packaging finished goods as the packaging insert is present and available when the manufacturing process is complete. Finally, the dual-function recyclable platform can be recycled within the typical recycle stream of a end-user or consumer.

In one aspect, the present invention relates to an apparatus that serves the dual-function of serving as a work holder during an assembly process and a packaging insert during transport of the finished goods. The apparatus can include a retaining means that is beneficial for retaining the manufactured goods in either function. The apparatus further comprises a platform comprising a typical recyclable material, most typically cardboard.

In another aspect, the present invention relates to a recyclable dual-function platform system for use in assembling goods and transporting them to a desired location. The recyclable dual-function system comprises a recyclable material, most typically cardboard. The recyclable dual-function system can include retaining means that is equally beneficial in either the assembly or transport environment. Generally, the recyclable dual-function system functions as a work holder during an assembly process and as a protective insert during the transport process.

In another aspect, the present invention relates to a method for using a dual-function recyclable platform to assemble and transport finished goods. Generally, the method comprises using the platform as a work holder during an assembly process and as a protective insert during the transport process. In addition, the method may further comprise recycling the platform once its use as a protective insert is complete.

DETAILED DESCRIPTION OF THE PREFERRED EMBODIMENTS

The dual-function platform of the present invention allows a single assembly to act as both a work platform during an assembly process and as a protective cover during a shipping process. In a preferred embodiment, the dual-function platform is comprised of a recyclable material to significantly eliminate the waste products often associated with other protective packing materials. As contained herein, the dual-function platform of the present invention is described with reference to the assembly of an electronic good. It will be understood that the dual-function platform is contemplated for use with other finished goods that could benefit from using a single assembly that can convert from a work platform to a protective cover.

Figure 1:
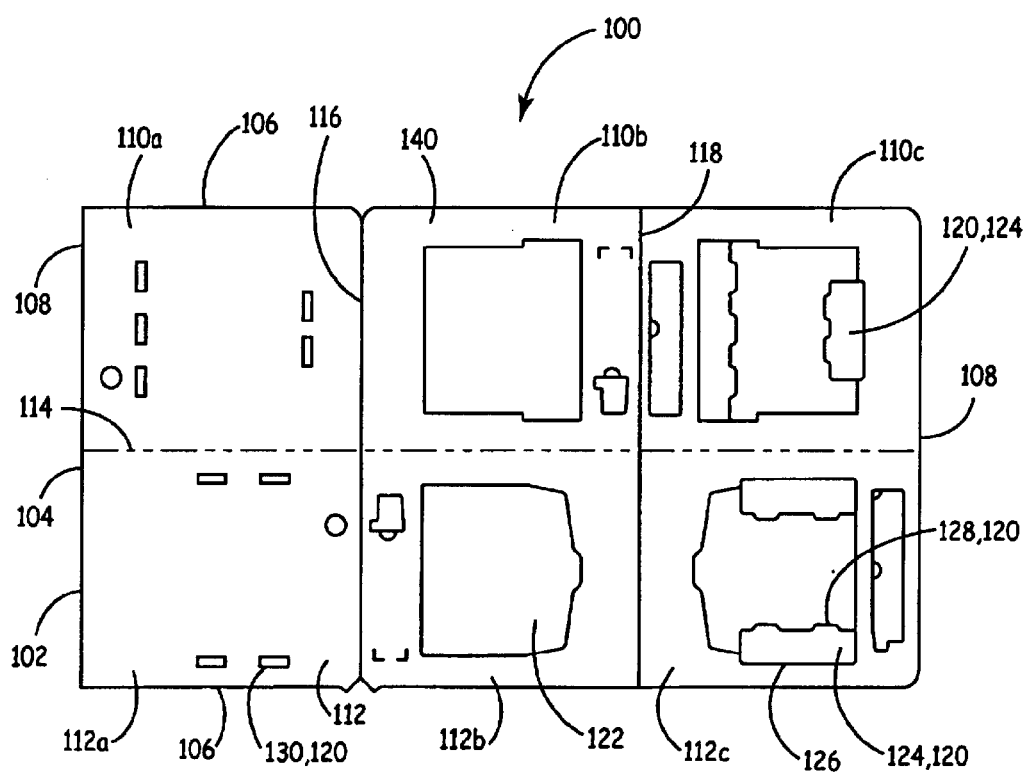
FIG. 1 is a top view of an embodiment of a flat sheet of the present invention.

As depicted in FIG. 1, a dual-function platform 100 of the present invention initially comprises a flat sheet 102. Flat sheet 102 is comprised of a material, most preferably cardboard, that is not only recyclable but also possesses sufficient strength to transport and protect a finished good. Flat sheet 102 has a generally rectangular perimeter 104 defined by a pair of lengths 106 and a pair of widths 108. Flat sheet 102 is divided into a pair of half sheets 110, 112 by a scored line 114. Flat sheet 102 further includes a pair of creases 116, 118 dividing half sheet 110 into three equivalently sized sections 110a, 110b, 110c and dividing half sheet 112 into three equivalently sized sections 112a, 112b, 112c.

As depicted in FIG. 1, flat sheet 102 is configured for use in assembling, transporting and protecting an electronic good. To accommodate the electronic good, section 110a, 110b, 110c, 112a, 112b and 112c include an array of retaining elements 120. Examples of retaining elements 120 can include a product knockout 122 conforming to the shape and size of the good, a retaining surface 124 having a retaining crease 126 and a retaining tab 128 or a retaining knockout 130.

Figure 2:
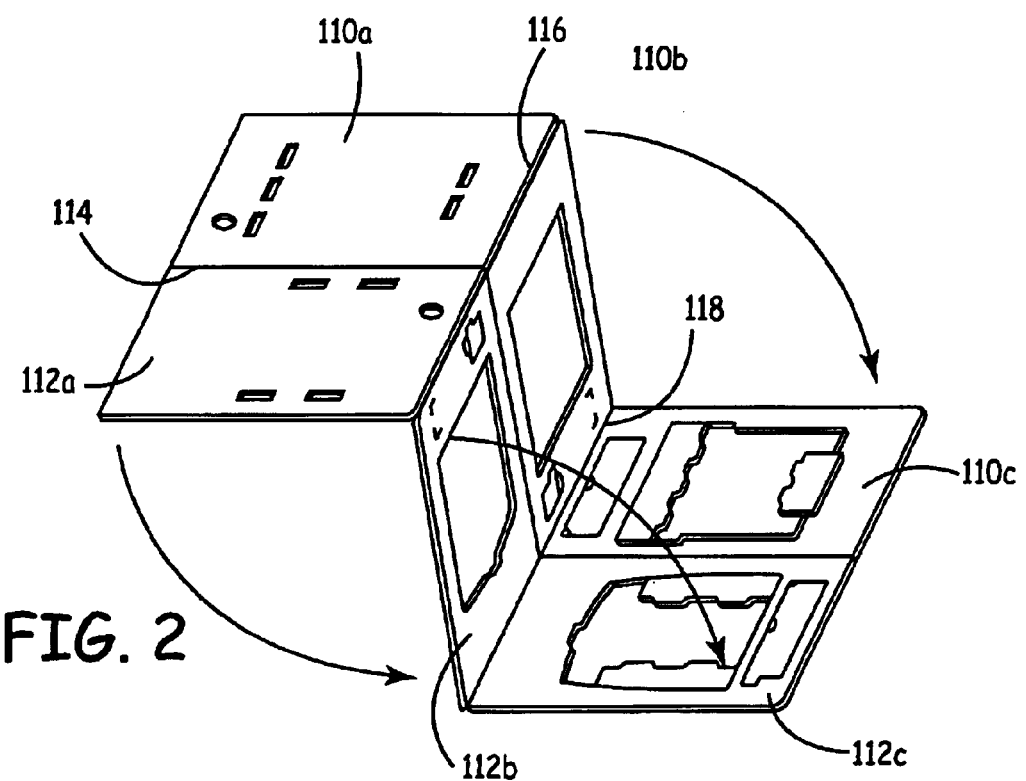
FIG. 2 is a perspective view of the flat sheet depicted in FIG. 1.
Figure 3:
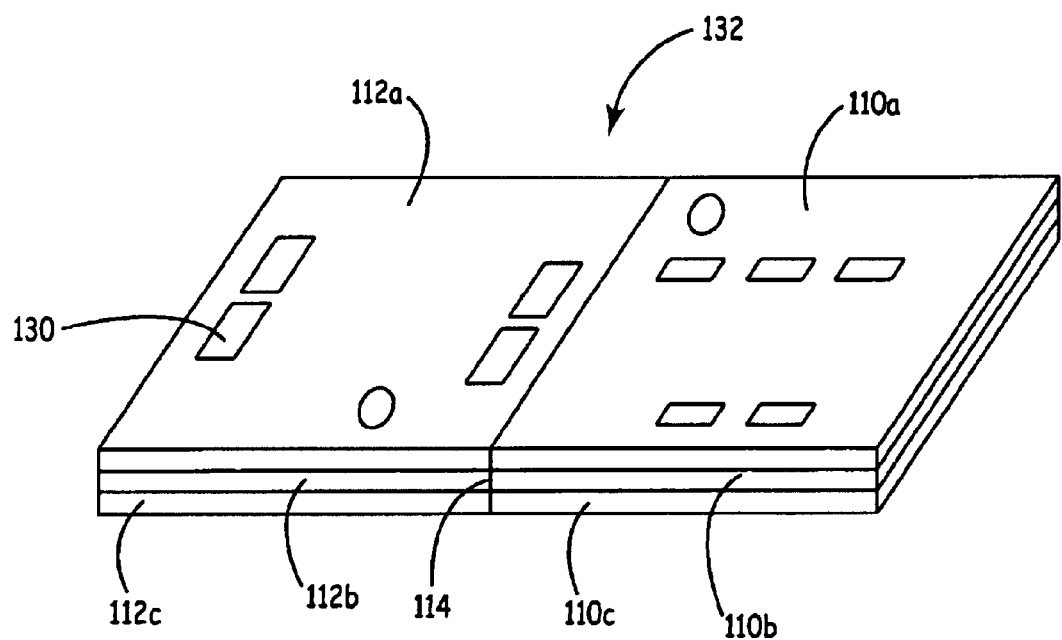
FIG. 3 is a perspective view of an embodiment of a work platform of the present invention.

Prior to use in assembling, transporting and protecting goods, flat sheet 102 is converted into a work platform 132. As depicted in FIGS. 2 and 3, work platform 132 is folded accordion style using creases 116, 118. Flat sheet 102 is folded using crease 118 such that sections 110b and 112b fold over the top of 110c and 112c. Sections 110a and 112a are then folded around crease 116 such that sections 110b and 112b are sandwiched between sections 110a, 112a and sections 110c, 112c. Preferably, an adhesive is applied prior to any folding such that work platform 132 cannot be unfolded.

Figure 4:
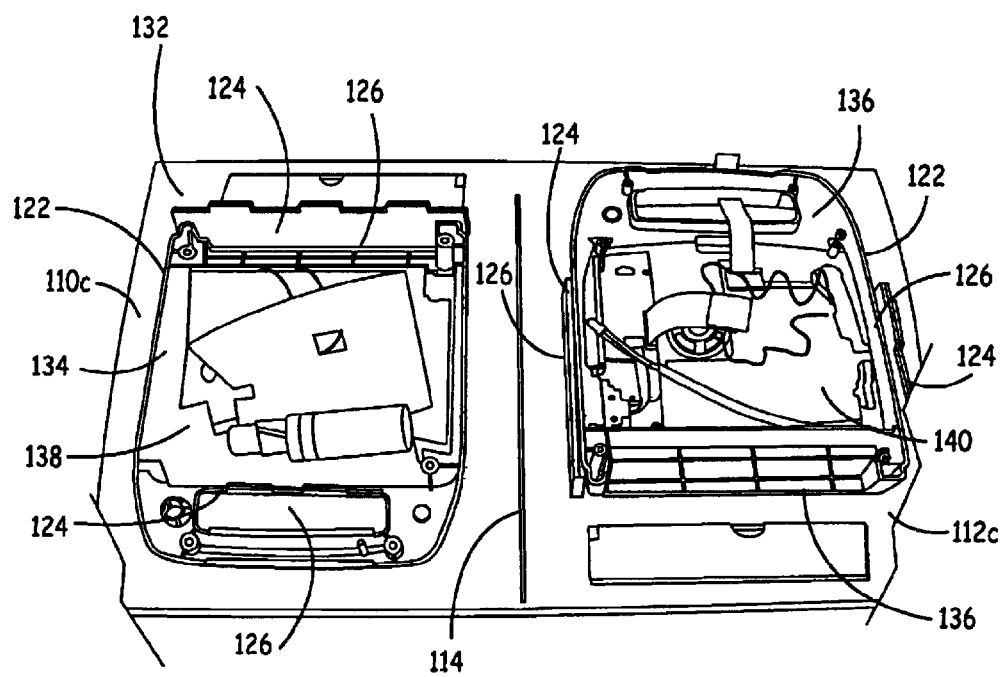
FIG. 4 is a top view of the work platform of FIG. 3 including a first body portion and a second body portion of an electronic good.

Following the conversion of flat sheet 102 into work platform 132, work platform 132 is ready for use in assembling, transporting and protecting goods. As depicted in FIG. 4, an electronic good, more specifically an Automated External Defibrillator (AED), comprises a first body portion 134 and a second body portion 136. First body portion 134 is positioned on section 110c. First body portion 134 is retained on section 110c through the combination of a pair of retaining surfaces 124 folded upward at retaining creases 126 as well as product knockout 122 conforming to the shape of first body portion 134. Second body portion 136 is retained on section 112c through the combination of a pair of retaining surfaces 124 folded upward at retaining creases 126 as well as product knockout 122 conforming to the shape of second body portion 136. First body portion 134 and second body portion 136 are positioned such that work platform 132 presents a first body interior 138 and a second body interior 140 such that assembly personnel can install, wire, and otherwise assemble the electronic good. Using work platform 132, first body portion 134 and second body portion 136 can be transported to any number or variety of work stations throughout the assembly process.

Figure 5:
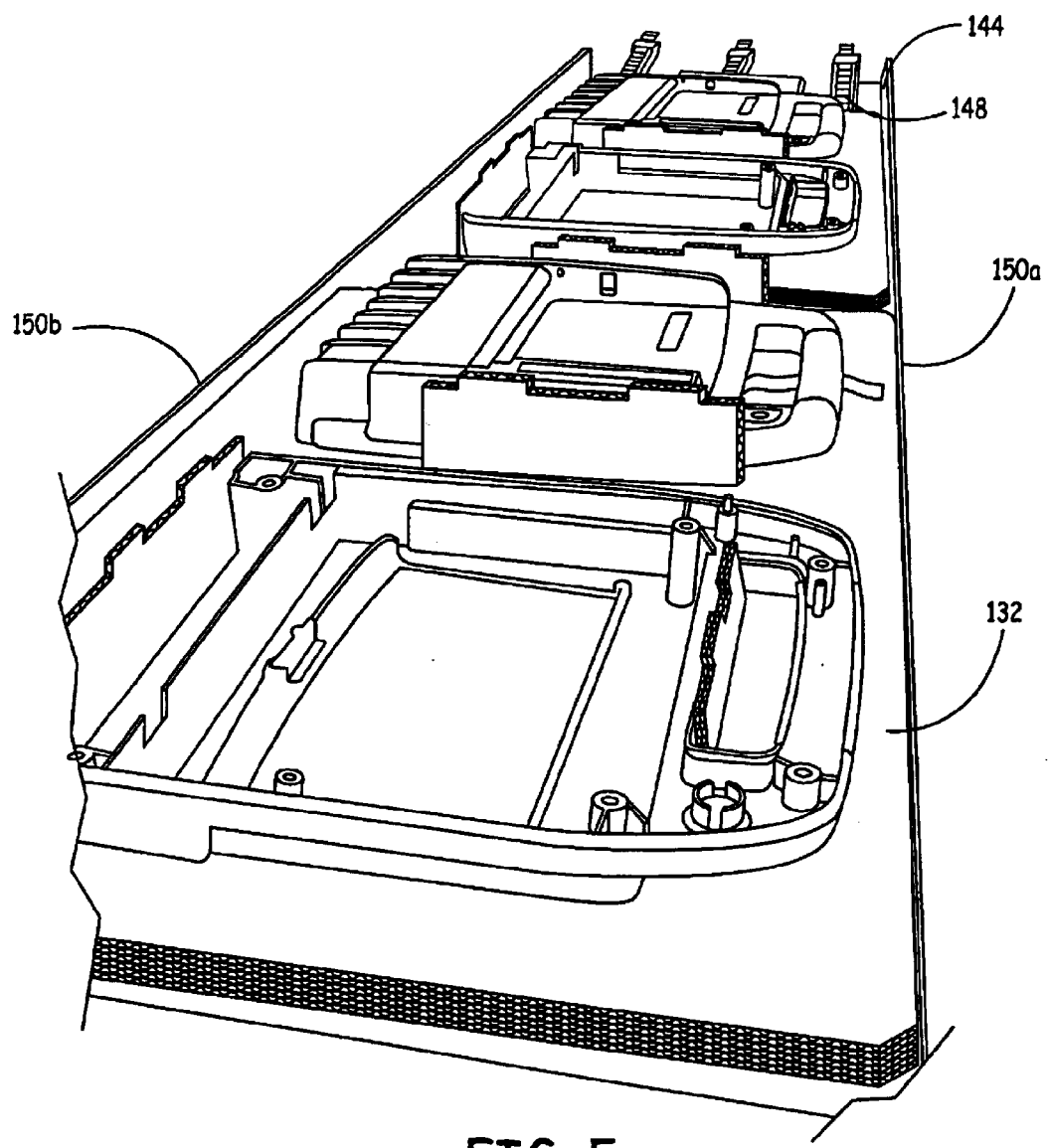
FIG. 5 is a perspective view of the work platform of FIG. 3 on a conveyor.
Figure 6:
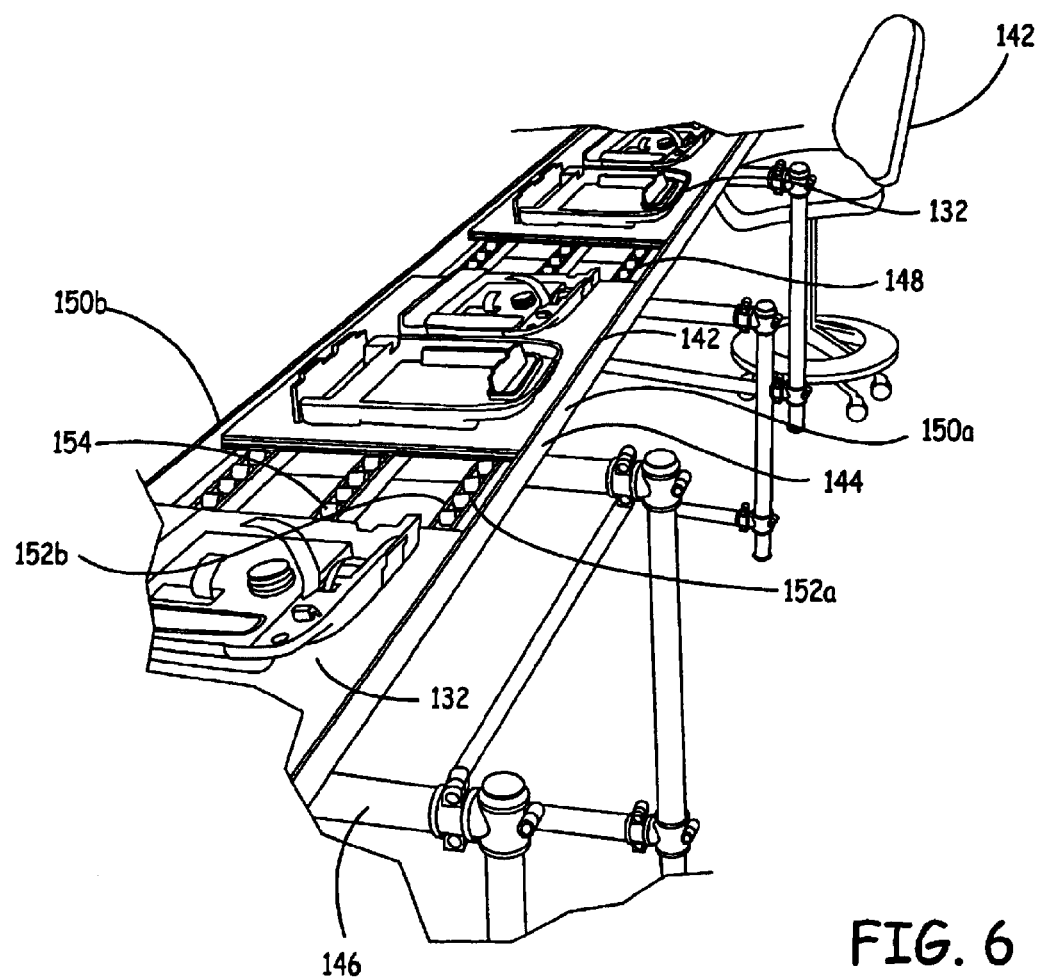
FIG. 6 is a perspective view of an assembly area.
Figure 7:
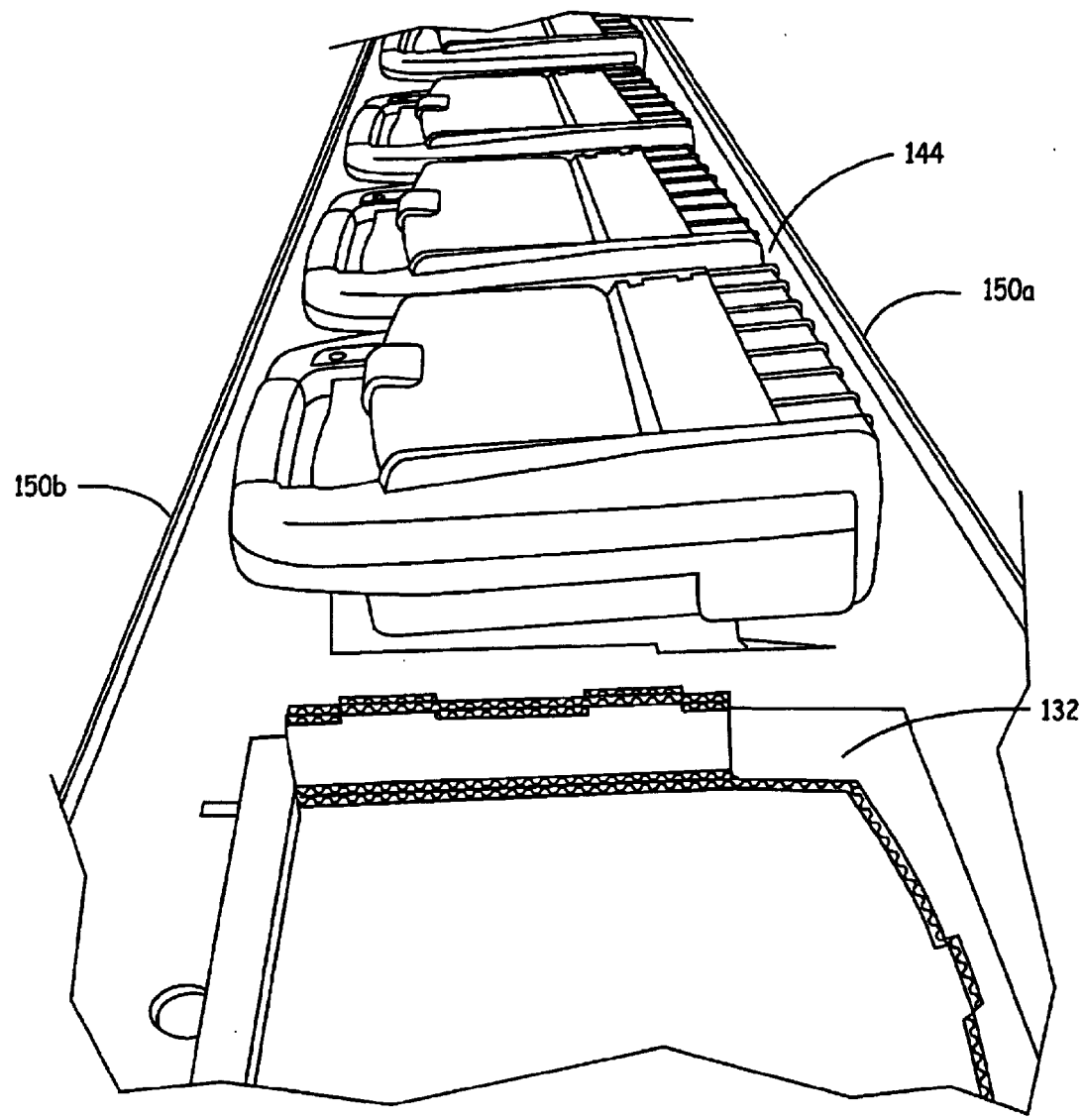
FIG. 7 is a perspective view of the work platform of FIG. 3 on a conveyor.

Transportation and storage of work platform 132 throughout the assembly process is depicted in FIGS. 5, 6, and 7. Generally, work platform 132 is transported between a plurality of workstations 142, each workstation 142 completing a specific portion of the assembly process. Workstations 142 are set up along the length of a transport system such as roller conveyor 144. Roller conveyor 144 comprises a support frame 146, a plurality of roller tracks 148 and a pair of side guards 150a, 150b. Each roller track 148 includes a pair of channels 152a, 152b and a plurality of individual rollers 154. Roller conveyor 144 is dimensioned such that the distance between side guards 150a, 150b is slightly larger than the distance between widths 108 when configured as work platform 132. Side guards 150a, 150b prevent work platform 132 from falling off either the front or back of roller conveyor 144 during assembly or transport.

Figure 8:
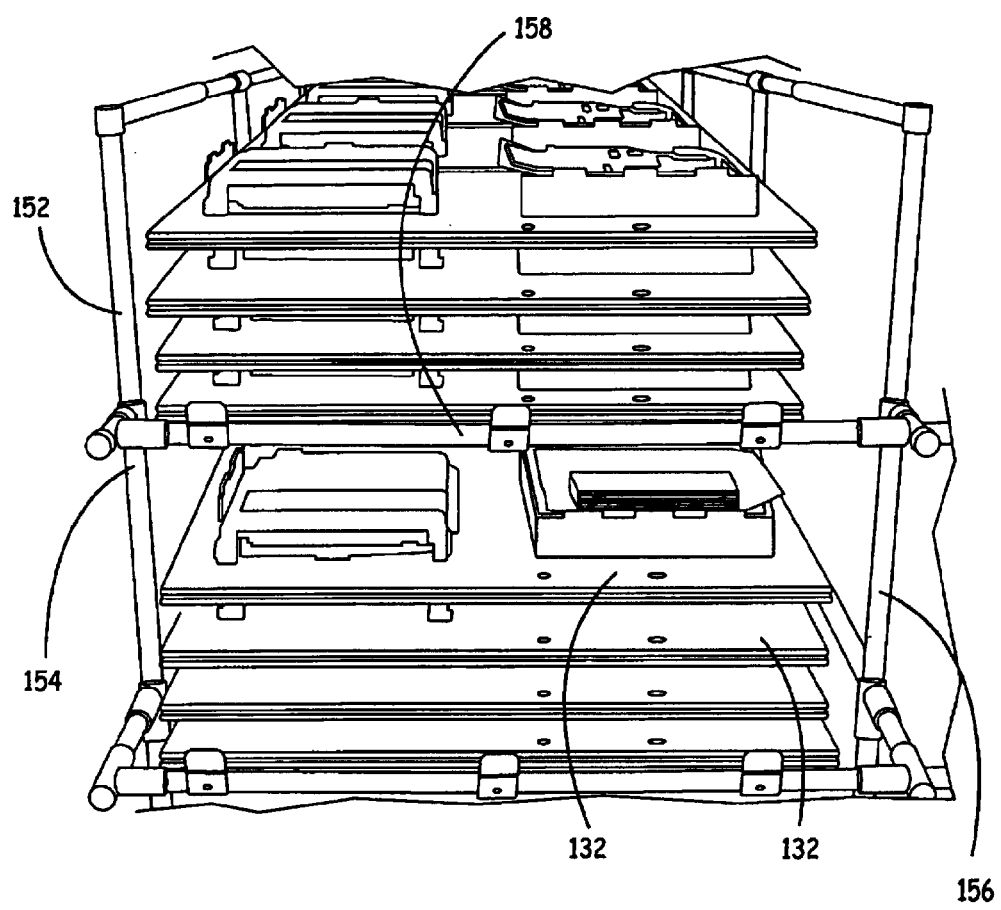
FIG. 8 is a perspective view of the work platform of FIG. 3 on a storage rack.

As shown in FIG. 8, work platform 132 can easily be stored between the various assembly stages. Generally, a plurality of work platforms 132 can be stacked and organized on a storage rack 152. Storage rack 152 comprises a storage frame 154 including a plurality of vertical members 156 and horizontal members 158. Storage frame 154 is dimensioned such that a plurality of work platforms 132 can be stacked on top of each other. Generally, work platforms 132 are stacked and aligned such that the retaining tabs 128 on one work platform 132 sliding insert into the retaining knockouts 130 present on a bottom surface of the above work platform 132. In this manner, work platforms 132 can be retainably secured until the next stage of the assembly process.

Figure 9:
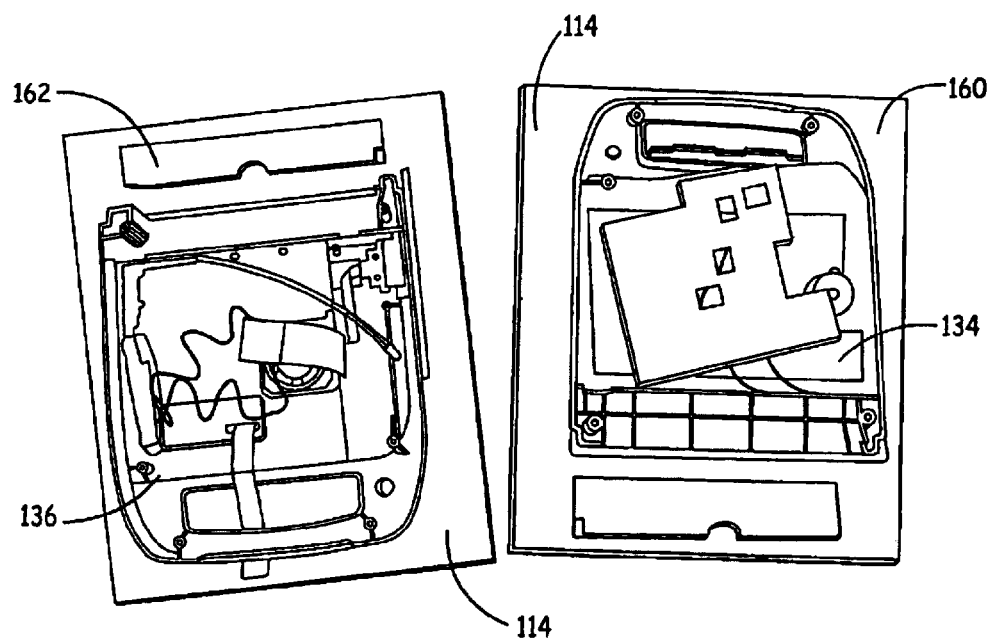
FIG. 9 is a top view of an embodiment of a first protective assembly and a second protective assembly including a first body portion and a second body portion of an electronic good.
Figure 10:
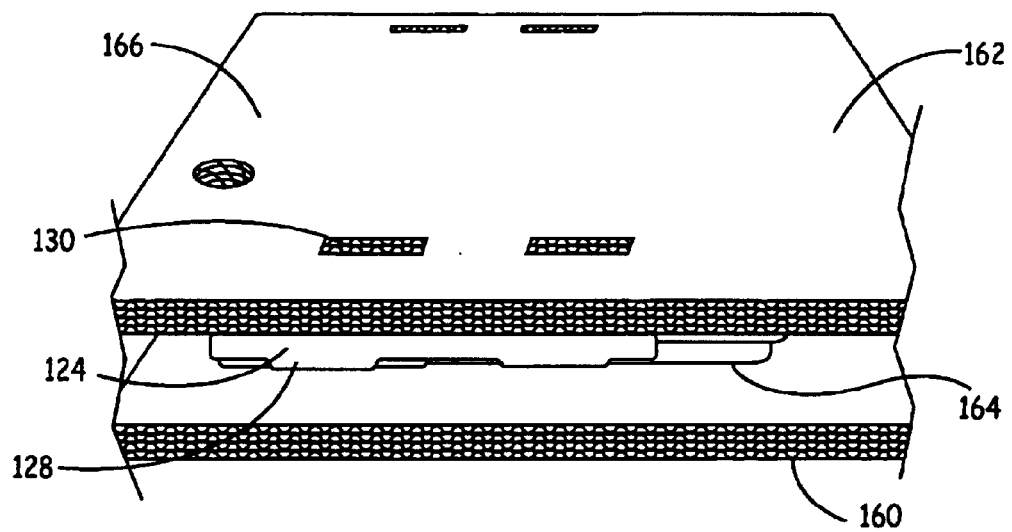
FIG. 10 is a perspective view of an embodiment of a completed protective assembly including a completed electronic good.
Figure 11:
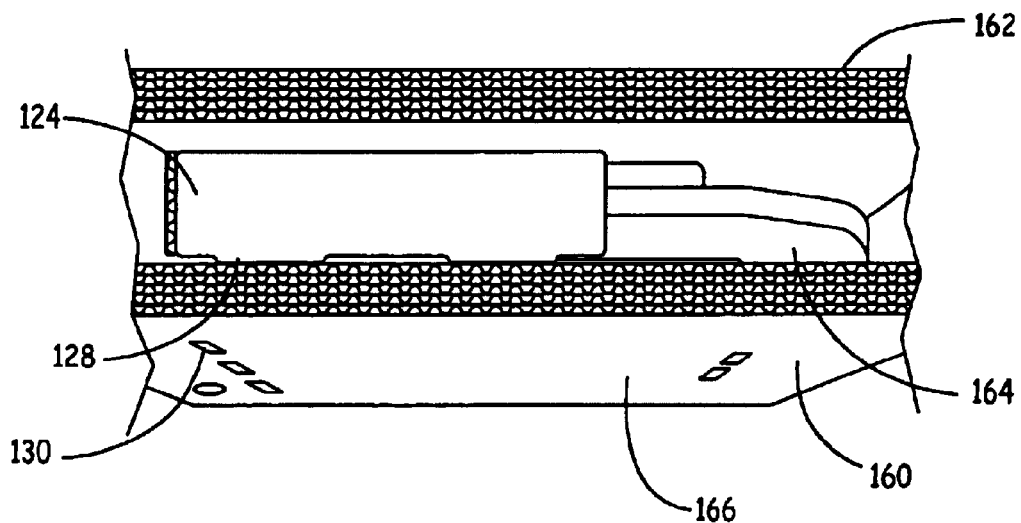
FIG. 11 is a perspective view of the completed protective assembly of FIG. 10.
Figure 12:
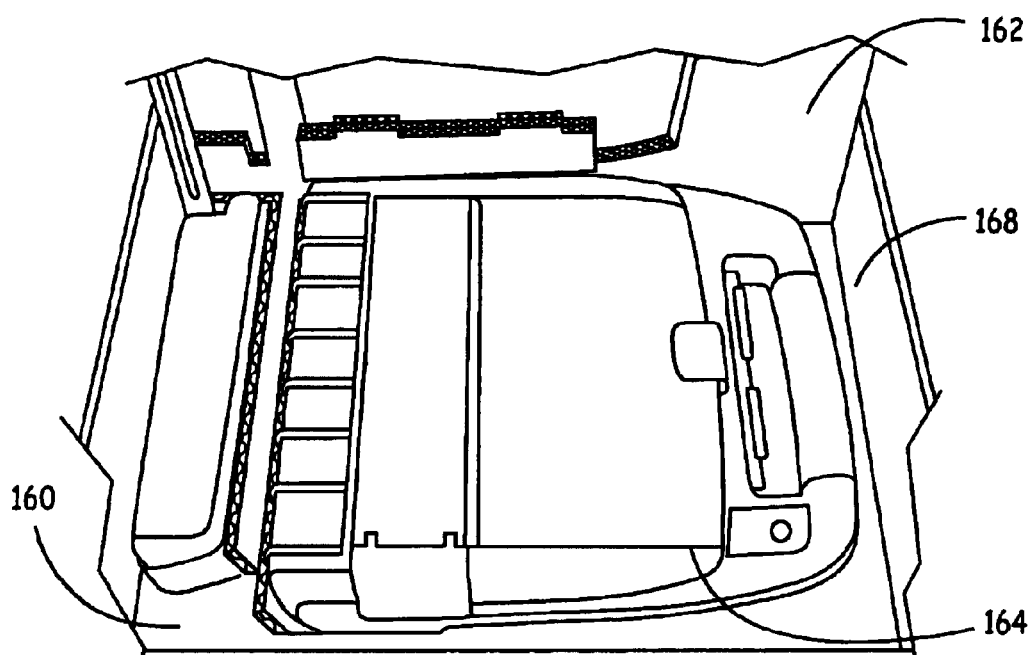
FIG. 12 is a perspective view of an embodiment of a shipping assembly including a completed electronic good.
Figure 13:
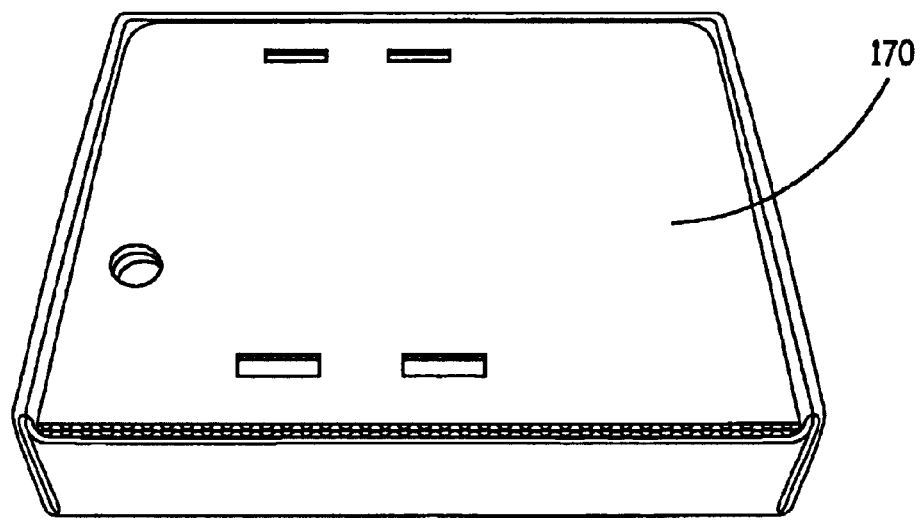
FIG. 13 is a perspective view of the shipping assembly of FIG. 12.

Following completion of the assembly process of first body portion 134 and second body portion 136, work platform 132 can be separated along scored line 114 to create a first protective assembly 160 and a second protective assembly 162 as depicted in FIG. 9. Assembly personnel can then assemble first body portion 134 and second body portion 136 into a completed good, 164 as seen in FIG. 10. As depicted in FIGS. 10 and 11, first protective assembly 160 and second protective assembly 162 are physically coupled to create a completed protective assembly 166. Completed protective assembly 166 is coupled using retaining surfaces 124 having retaining tabs 128 as well as retaining knockouts 130 that are present on both first protective assembly 160 and second protective assembly 162. For instance, retaining tabs 128 on first protective assembly 160 slidingly inserts into opposing retaining knockouts 130 on second protective assembly 162. Completed protective assembly 166 provides top and bottom protection for completed good 164. Completed good 164 is also prevented from experiencing side-to-side movement within completed protective assembly 166 by retaining surfaces 124 around all four sides of completed good 164. Following assembly of completed protective assembly 166, completed protective assembly 166 can be placed into a box 168 as depicted in FIGS. 12 and 13. Box 168 is dimensioned such that completed protective assembly 166 snugly fits within box 168 so that completed good 164 is not subject to movement or bouncing within box 168. As seen in FIG. 12, completed protective assembly 166 has been separated into first protective assembly 160 and second protective assembly 162 to more clearly depict completed good 164 present within box 168. Preferably, box 168 comprises the same material as flat sheet 102, i.e., cardboard, such that a shipping assembly 170 comprised of box 168 and completed protective assembly 166 is completely recyclable as part of the normal consumer recycling stream.

Although various embodiments of the present invention have been disclosed here for purposes of illustration, it should be understood that a variety of changes, modifications and substitutions may be incorporated without departing from either the spirit or scope of the present invention.

What is claimed is:

1. A method for assembling and packaging a good, the method comprising the steps of:

providing a goods support surface having a plurality of coplanar sections;

placing at least a portion at a housing of an unassembled good atop at least one of said coplanar sections;

configuring said goods support surface into a first configuration, wherein said portion of said housing is retained in a substantially immovable yet accessible position;

assembling said goods while said portion of said housing is retained; and configuring said goods support surface into a second configuration, wherein said coplanar sections are arranged in a non-coplanar orientation that substantially surrounds the assembled good to provide a protective housing.

2. The method of claim 1, wherein said step of configuring said goods recyclable material.

3. The method of claim 1, wherein said step of configuring said goods support surface into a second configuration comprises interfacing a plurality of interfacing elements on the coplanar sections.

4. The method of claim 1, wherein said plurality of coplanar sections includes a plurality of retaining elements to provide said substantially immovable yet position or a plurality of interfacing elements that interface to substantially surround said assembled good.

5. The method of claim 1, further comprising storing a plurality of goods support surfaces during assembly in a secured vertical stack arrangement.

6. The method of claim 5, wherein the vertical stack arrangement is secured by retainably interfacing a bottom goods support surface with a top goods support surface.

7. A dual function platform for goods assembly and packaging, the platform comprising:

a goods assembly platform configurable between a first assembly orientation and a second protective orientation, wherein said first assembly orientation of said goods assembly platform presents a plurality of coplanar sections wherein at least one section includes a goods retaining member; and wherein said second protective orientation of said goods assembly platform presents said plurality of coplanar sections in a non-coplanar configuration and wherein said non-coplanar configuration provides a protective housing about said goods retaining member.

8. The dual function platform of claim 1, wherein said goods assembly platform is of a recyclable material.

9. The dual function platform of claim 1, wherein said goods assembly platform further includes a plurality of goods retaining members to provide a substantially immovable goods position.

10. The dual platform of claim 1, wherein said goods assembly platform includes a plurality of interfacing elements that interface to form said protective housing.

11. The dual function platform of claim 1, wherein said goods assembly platform includes a plurality of goods retaining members to provide a substantially immovable goods position and wherein said goods assembly platform includes a plurality of interfacing elements that interface to form said protective housing.

12. A dual function platform for goods assembly and packaging, said platform comprising:

means for supporting at least a portion of a housing of an unassembled good, wherein said means for supporting includes a plurality of coplanar sections wherein at least one of said coplanar sections includes means for retaining said housing an a substantially immovable but accessible position for assembly of said good; and wherein said means for supporting includes means for interfacing portions of said means for supporting such that the coplanar sections assume a non-coplanar orientation for creating a protective housing.

13. The platform of claim 12, wherein said means for retaining additionally retains an assembled good within said protective housing.

14. The platform of claim 12, wherein said means for supporting comprises a recyclable material.

* * * * *

UNITED STATES PATENT AND TRADEMARK OFFICE
CERTIFICATE OF CORRECTION

PATENT NO. : 6,948,295 B2  
APPLICATION NO. : 10/447682  
DATED : September 27, 2005  
INVENTOR(S) : Patrick L. Biggins Page 1 of 1

It is certified that error appears in the above-identified patent and that said Letters Patent is hereby corrected as shown below:

Column 4, line 59, please delete "at" and insert --of--.

Signed and Sealed this

Twenty-fifth Day of December, 2007

JON W. DUDAS  
*Director of the United States Patent and Trademark Office*